(12) United States Patent
Liu et al.

(10) Patent No.: US 6,400,199 B1
(45) Date of Patent: Jun. 4, 2002

(54) FULLY DIFFERENTIAL DOUBLE EDGE TRIGGERED FLIP-FLOP

(75) Inventors: Hung-Chih Liu, Hsinchu; Hsian-Feng Liu, Kaohsiung Hsien, both of (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 0 days.

(21) Appl. No.: 09/835,798

(22) Filed: Apr. 16, 2001

(51) Int. Cl.⁷ .............................................. H03K 3/289
(52) U.S. Cl. ...................................... 327/202; 327/215
(58) Field of Search ....................... 327/52–57, 200–204, 327/208, 210–212, 215

(56) References Cited

U.S. PATENT DOCUMENTS

| | | | |
|---|---|---|---|
| 4,629,909 A | 12/1986 | Cameron | 327/211 |
| 5,250,858 A | 10/1993 | Strong | 327/216 |
| 5,327,019 A | 7/1994 | Kluck | 327/202 |
| 5,656,962 A | * 8/1997 | Banik | 327/202 |

* cited by examiner

Primary Examiner—Kenneth B. Wells
(74) Attorney, Agent, or Firm—Jenkens & Gilchrist, P.C.

(57) ABSTRACT

A fully differential double edge triggered flip-flop stores and outputs first and second fully differential input values on leading and trailing edges of a clock. The flip-flop includes a first fully differential master circuit, a second fully differential master circuit and a fully differential slave circuit. The first master circuit stores the first input value during the period from the leading edge to trailing edge of the clock. The second master circuit stores the second input value during the period from the trailing edge to leading edge of the clock. The slave circuit is electrically connected to outputs of the first and second master circuits. The slave circuit includes a second repeater as an output end of the flip-flop, outputs the first input value on the trailing edge of the clock, and outputs the second input value on the leading edge of the clock.

13 Claims, 9 Drawing Sheets

FULLY DIFFERENTIAL DOUBLE EDGE TRIGGERED FLIP-FLOP

BACKGROUND OF THE INVENTION

1. Field of the Invention

The present invention relates to a fully differential flip-flop, and particularly to a fully differential flip-flop triggered on leading and trailing edges of a clock signal.

2. Description of Related Art

Known flip-flops used a method of a single-ended input and leading edge trigger to capture input data. However, the method of a single-ended input is often interfered by noises in a high frequency operation, and the method of a leading edge trigger will limit the operational speed of a flip-flop.

In a U.S. Pat. No. 4,629,909, entitled "FLIP-FLOP FOR STORING DATA ON BOTH LEADING AND TRAILING EDGES OF CLOCK SIGNAL," disclosed a method to resolve the above problems. Even the prior art utilizes leading and trailing edges of a clock signal to capture a single input data, the application of the prior art is only suitable to a specific circuit, not all kinds of flip-flops.

In a U.S. Pat. No. 5,327,019, entitled "DOUBLE EDGE SINGLE DATA FLIP-FLOP CIRCUITRY," disclosed a method to trigger on leading and trailing edges by utilizing two flip-flops and a logic circuit. The prior art costs much hardware, and its operational speed is limited due to passing a series of logic gates. Besides, the prior art utilizes a single-ended input that limits its ability to filter noises.

In a U.S. Pat. No. 5,250,858, entitled "DOUBLE-EDGE TRIGGERED MEMORY DEVICE AND SYSTEM," disclosed a method to capture data on leading and trailing edges by utilizing two flip-flops and a switch circuit. Like the disadvantages as mentioned above, the prior art cost much hardware, and its operational speed is limited due to passing a series of logic gates.

SUMMARY OF THE INVENTION

A first object of the present invention is to propose a fully differential flip-flop capturing data on leading and trailing edges of a clock signal.

A second object of the present invention is to propose a fully differential flip-flop having the characteristic of differential inputs and well noise filter.

A third object of the present invention is to propose a low cost and high-speed fully differential flip-flop.

For achieving the above objects, the present invention proposes a fully differential double edge triggered flip-flop which stores and outputs first and second fully differential input values on leading and trailing edges of a clock. The fully differential double edge triggered flip-flop comprises a first fully differential master circuit, a second fully differential master circuit and a fully differential slave circuit. The first fully differential master circuit stores the first fully differential input value during the period from the leading edge to trailing edge of the clock. The second fully differential master circuit stores the second fully differential input value during the period from the trailing edge to leading edge of the clock. The fully differential slave circuit is electrically connected to outputs of the first and second fully differential master circuits. The fully differential slave circuit includes a second repeater as an output end of said fully differential double edge triggered flip-flop. The fully differential slave circuit outputs said first fully differential input value on the trailing edge of the clock, and outputs said second fully differential input value on the leading edge of the clock.

BRIEF DESCRIPTION OF THE DRAWINGS

The present invention will be described according to the appended drawings in which.

PREFERRED EMBODIMENT OF THE PRESENT INVENTION

Figure 1:
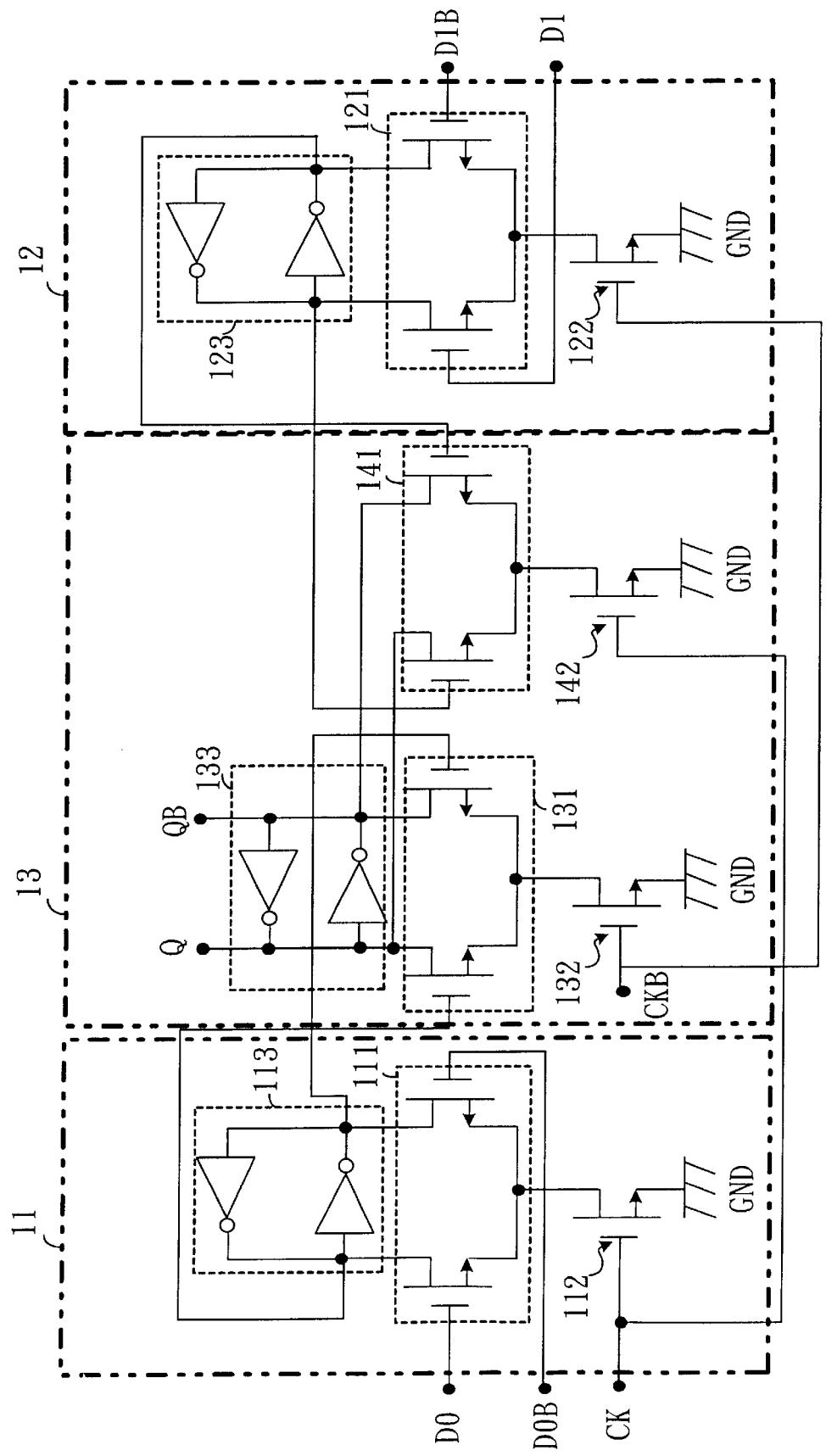
FIG. 1 shows a first embodiment of the fully differential double edge triggered flip-flop of the present invention.

FIG. 1 shows a first embodiment of the fully differential double edge triggered flip-flop of the present invention. The fully differential double edge triggered flip-flop 10 utilizes leading and trailing edges of a clock CK. A clock CKB represents a phase complement of the clock CK. The fully differential double edge triggered flip-flop 10 has two sets of differential inputs, and they are first fully differential inputs D0 and D0B, and second fully differential inputs D1 and D1B. The D0 and D0B are fully differential inputs of a first master circuit 11, and DI and DIB are fully differential inputs of a second master circuit 12. The output ends of the first master circuit 11 and second master circuit 12 are electrically connected to a slave circuit 13 to form a two-to-one master-slave module. The first master circuit 11 comprises a first differential pair 111, a first transistor switch 112 controlled by the clock CK, and a first repeater 113. The second master circuit 12 comprises a first differential pair 121, a second transistor switch 122 controlled by the clock CKB, and a first repeater 123. The slave circuit 13 comprises a fifth differential pair 131 whose input ends are connected to two terminals of the first repeater 113 of the first master circuit 11, a third transistor switch 132 controlled by the clock CKB, a second repeater 133, a sixth differential pair 141 whose input ends are connected to two terminals of the first repeater 123 of the second master circuit 12, and a fourth transistor switch 142 controlled by the clock CK. The output of the sixth differential pair 141 is connected to two terminals of the second repeater 133, and the terminals Q and QB of the second repeater 133 are the outputs of the flip-flop 10.

Figure 2:
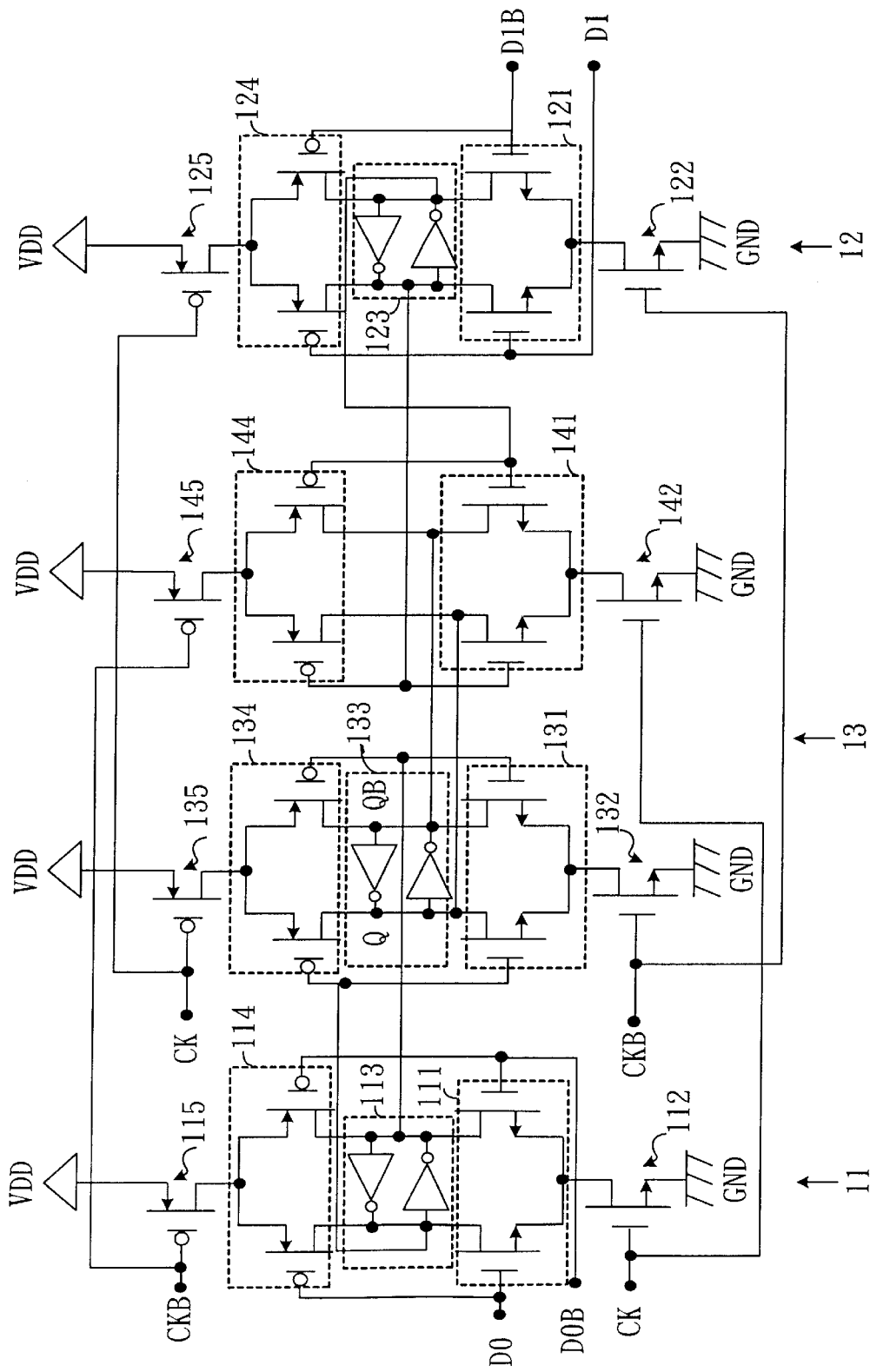
FIG. 2 shows a second embodiment of the fully differential double edge triggered flip-flop of the present invention.

FIG. 2 shows a second embodiment of the fully differential double edge triggered flip-flop of the present invention. In FIG. 1, the output switching speed from logic zero to logic one is less than that from logic one to logic zero, and the reason is that the first transistor switches 112 and 122 respectively controlled by the clock CK and CKB, the third transistor switch 132, and the fourth transistor switch 142 have only one unit, and they are situated beneath the first differential pairs 111 and 121, the fifth differential pair 131 and the sixth differential pair 141. The structure in FIG. 2 improves the embodiment shown in FIG. 1 by adding second differential pairs 114 and 124, a ninth differential pair 134 and tenth differential pair 144 having opposed polarities to the first differential pairs 111 and 121, fifth differential pair 131 and sixth differential pair 141 on the first repeaters 113 and 123, the second repeater 133 and the sixth differential pair 141. Furthermore, a second transistor pair 115 and 125, a fifth transistor switch 135 and sixth transistor switch 145 having opposed polarities to the first transistor switches 112 and 122, third transistor switch 132 and fourth transistor switch 142 are added respectively to the second differential pairs 114 and 124, the ninth differential pair 134 and the tenth differential pair 144. The input ends of the second differential pairs 114 and 124, the ninth differential pair 134 and tenth differential pair 144 are the same with those of the first differential pairs 111 and 121, the fifth differential pair 131 and sixth differential pair 141. The clock phases of the second transistor switches 115 and 125, the fifth transistor switch 135 and sixth transistor switch 145 are complementary to those of the first transistor switches 112 and 122, the third transistor switch 132 and the fourth transistor switch 142. Since the structure in FIG. 2 has a characteristic of vertical symmetries, the output switch from logic zero to logic one or from logic one to logic zero have the same operational speed.

Figure 3:
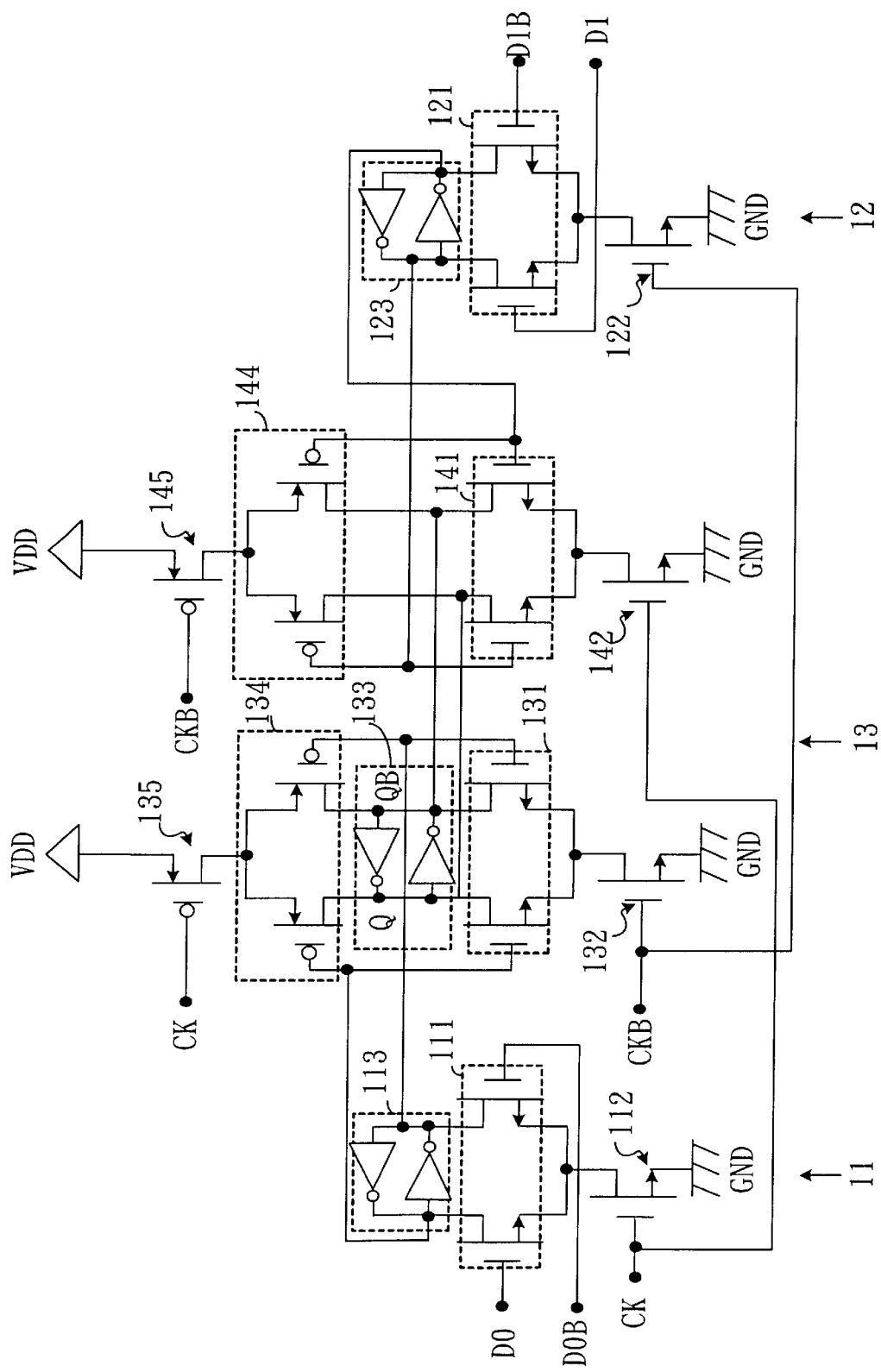
FIG. 3 shows a third embodiment of the fully differential double edge triggered flip-flop of the present invention.

FIG. 3 shows a third embodiment of the fully differential double edge triggered flip-flop of the present invention. The structure in FIG. 3 also improves unequal operational speeds from logic one to logic zero and from logic zero to logic one at output ends. The difference from the structure in FIG. 2 is that the structure in FIG. 3 does not have the second differential pairs 114 and 124 and the second transistor switches 115 and 125 on the first repeaters 113 and 123 of the first master circuit 11 and second master circuit 12.

Figure 4:
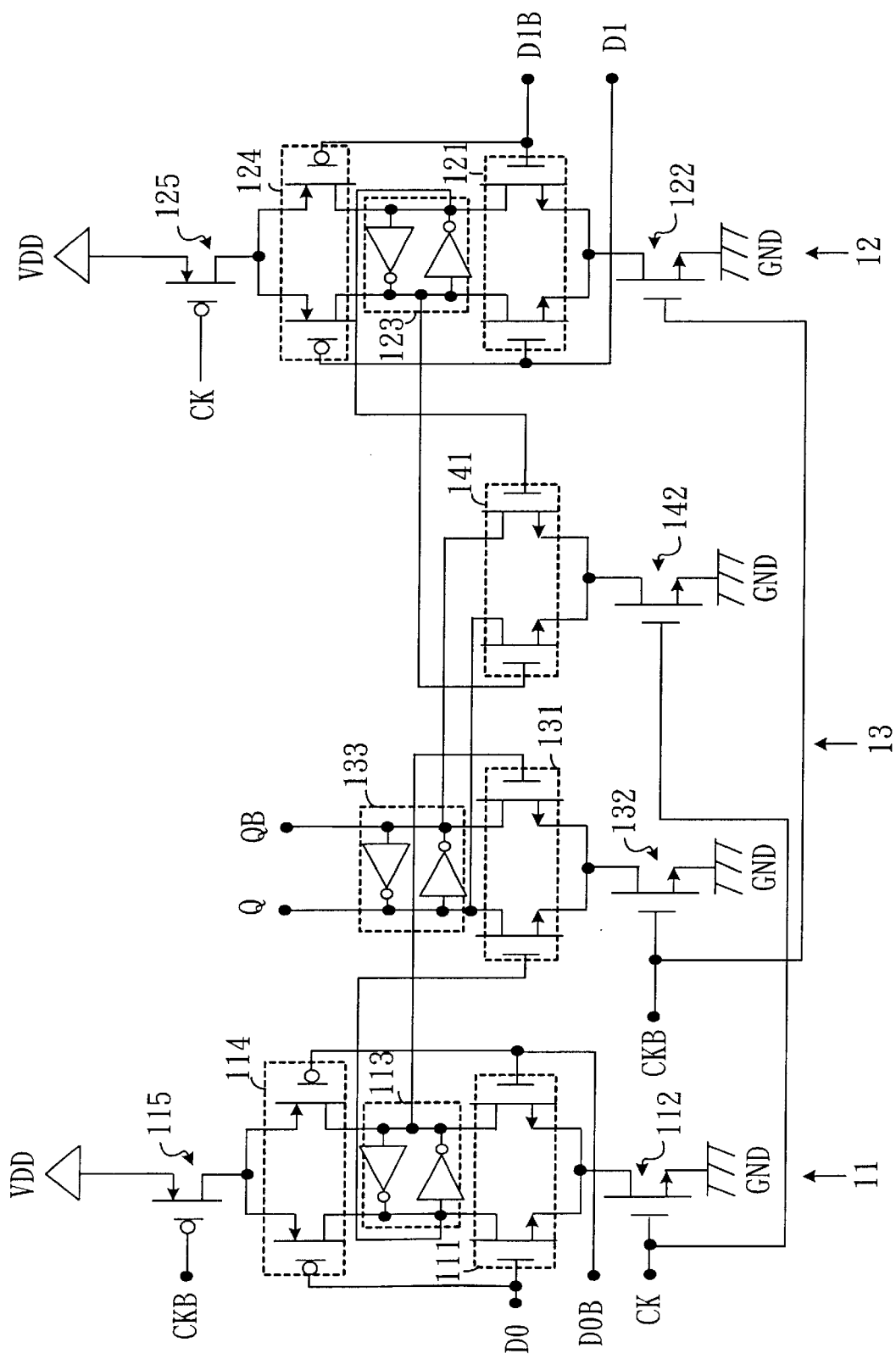
FIG. 4 shows a fourth embodiment of the fully differential double edge triggered flip-flop of the present invention.

FIG. 4 shows a fourth embodiment of the fully differential double edge triggered flip-flop of the present invention. The difference from the structure in FIG. 1 is that the structure in FIG. 4 only adds second differential pairs 114 and 124 and second transistor switches 115 and 125 on the first repeaters 113 and 123 of the first master circuit 11 and second master circuit 12. Another advantage of the structure in FIG. 4 is to have a smaller setup time and hold time.

Figure 5:
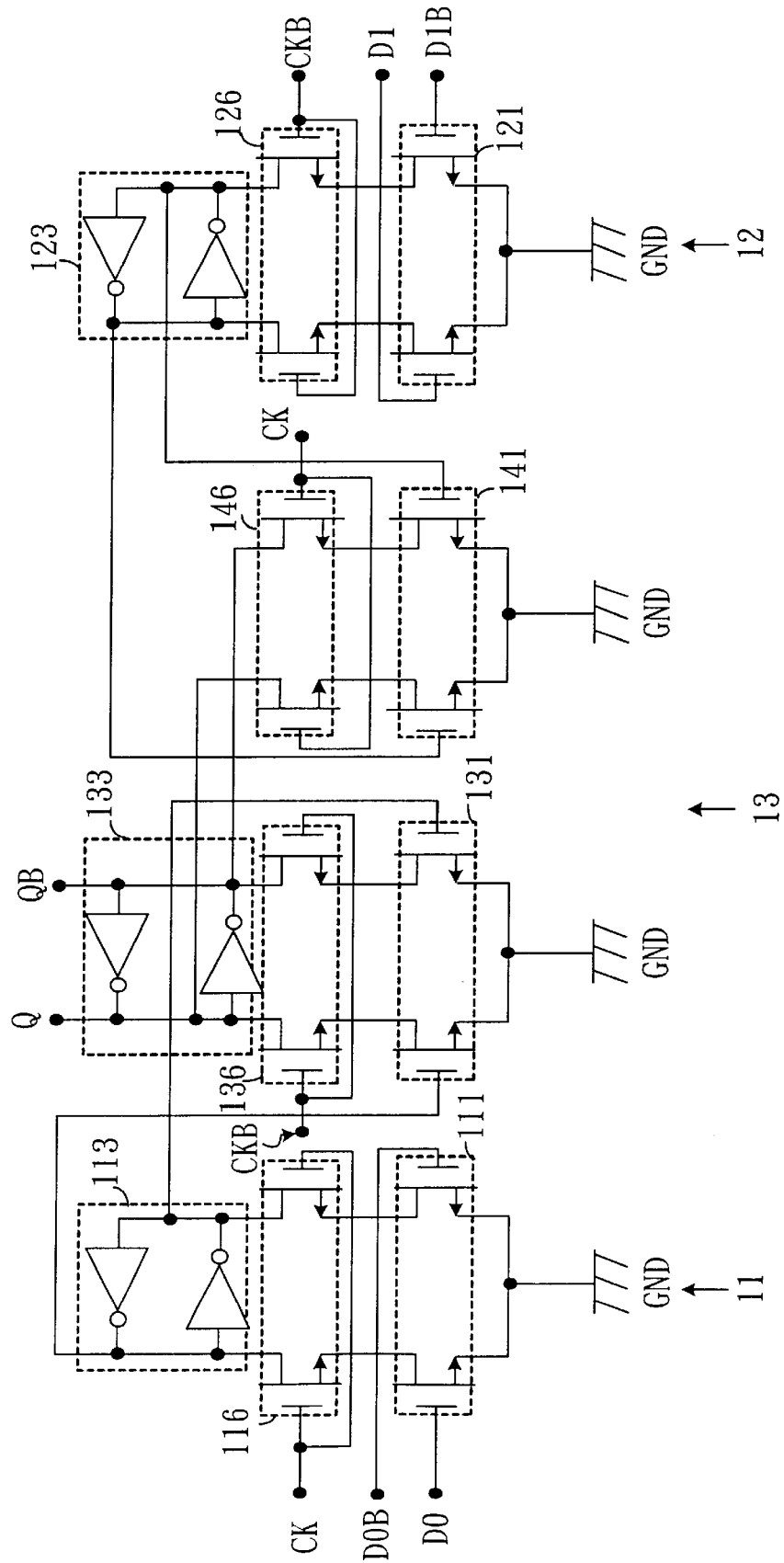
FIG. 5 shows a fifth embodiment of the fully differential double edge triggered flip-flop of the present invention.

FIG. 5 shows a fifth embodiment of the fully differential double edge triggered flip-flop of the present invention. The structure in FIG. 5 is to exchange the position of the first differential pairs 111 and 121 and the fifth differential pair 131 and the sixth differential pair 141 in FIG. 5 with the position of the first transistor switches 112 and 122, the third transistor switch 132 and the fourth transistor switch 142 in FIG. 5, and further to replace the first transistor switches 112 and 122, the third transistor switch 132 and the fourth transistor switch 142 with the third differential pairs 116 and 126, the seventh differential pair 136 and the eighth differential pair 146. An advantage of the structure in FIG. 5 is capable of avoiding interferences caused by parasitic capacitances.

Figure 6:
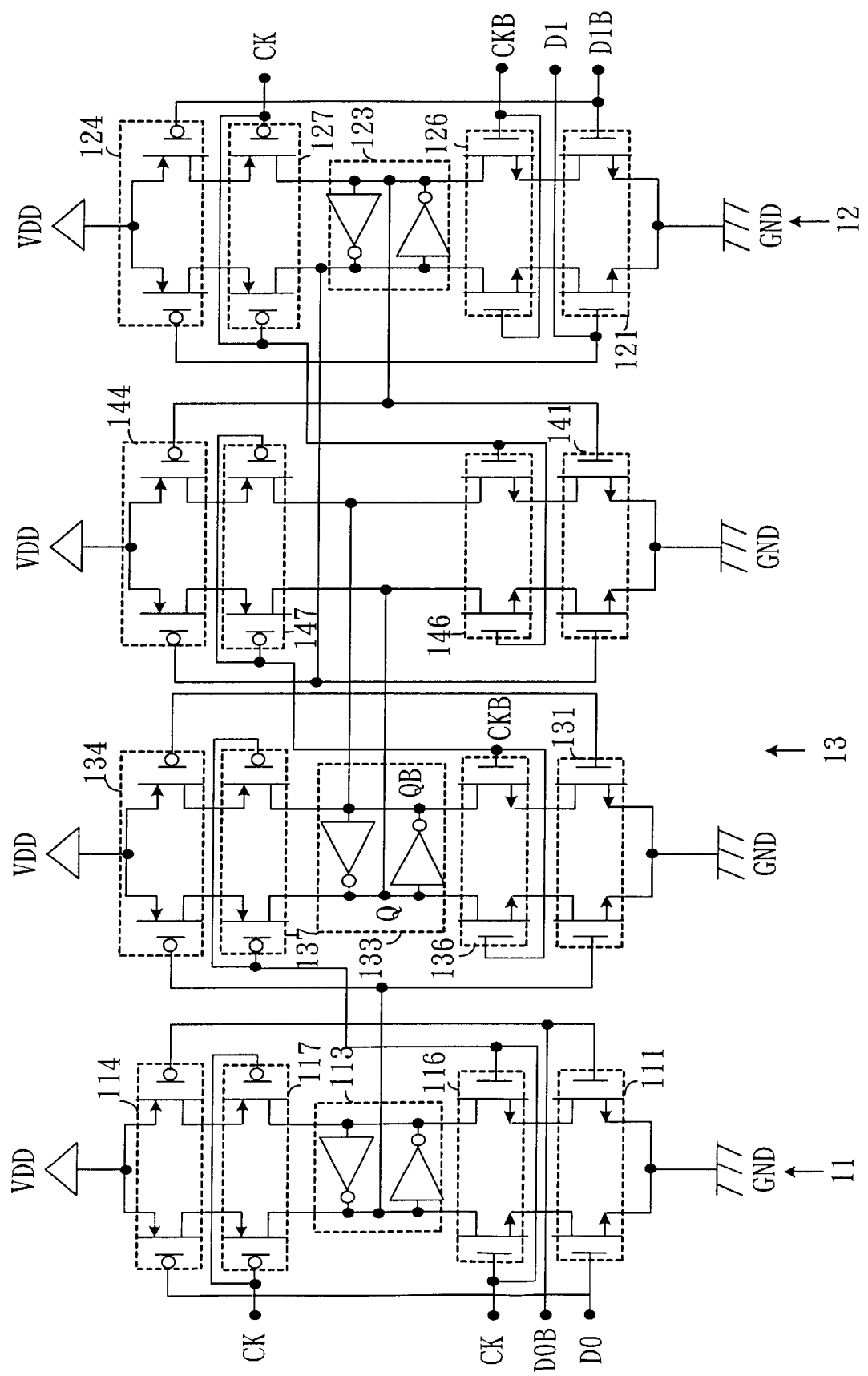
FIG. 6 shows a sixth embodiment of the fully differential double edge triggered flip-flop of the present invention.

FIG. 6 shows a sixth embodiment of the fully differential double edge triggered flip-flop of the present invention. Compared with the structure shown in FIG. 5, the structure in FIG. 6 adds fourth differential pairs 117 and 127, eleventh differential pair 137, twelfth differential pair 147 having opposed polarities to the third differential pairs 116 and 126, the seventh differential pair 136 and the eighth differential pair 146 on the first repeaters 113 and 123, the second repeater 133 and the eighth differential pair 146, and further add second differential pairs 114 and 124, the ninth differential pair 134, the tenth differential pair 144 having opposed polarities to the first differential pairs 111 and 121, the fifth differential pair 131 and the sixth differential pair 141 on the fourth differential pairs 117 and 127, the eleventh differential pair 137 and the twelfth differential pair 147. The input ends of the second differential pairs 114 and 124, the ninth differential pair 134, the tenth differential pair 144 are the same with those of the first differential pairs 111 and 121, the fifth differential pair 131 and the sixth differential pair 141. In addition, the clock phases of the fourth differential pairs 117 and 127, the eleventh differential pair 137 and the twelfth differential pair 147 are complementary to those of the third differential pairs 116 and 126, the seventh differential pair 136, the eighth differential pair 146. Since the structure in FIG. 2 has a characteristic of vertical symmetries, the output switch from logic zero to logic one and from logic one to logic zero have the same operational speed.

Figure 7:
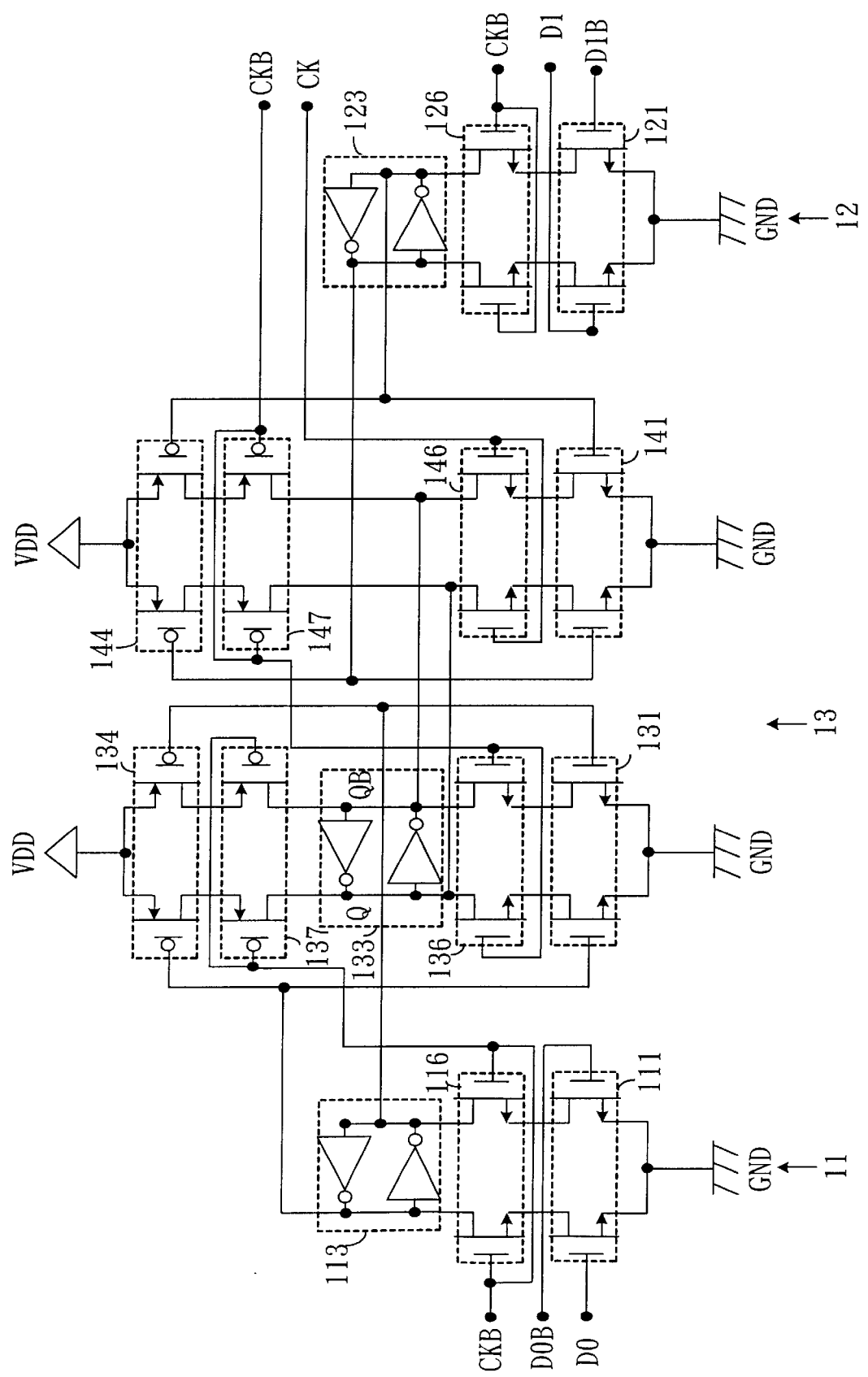
FIG. 7 shows a seventh embodiment of the fully differential double edge triggered flip-flop of the present invention.

FIG. 7 shows a seventh embodiment of the fully differential double edge triggered flip-flop of the present invention. The structure in FIG. 7 can also improve unequal operational speeds at output end transferring from logic zero to logic one and from logic one to logic zero, and be capable of avoiding interferences caused by parasitic capacitances. The difference from the structure in FIG. 6 is that the structure in FIG. 7 does not add the fourth differential pairs 117 and 127 and the second differential pairs 114 and 124 on the first repeater of the first master circuit 11 and the second master circuit 12.

Figure 8:
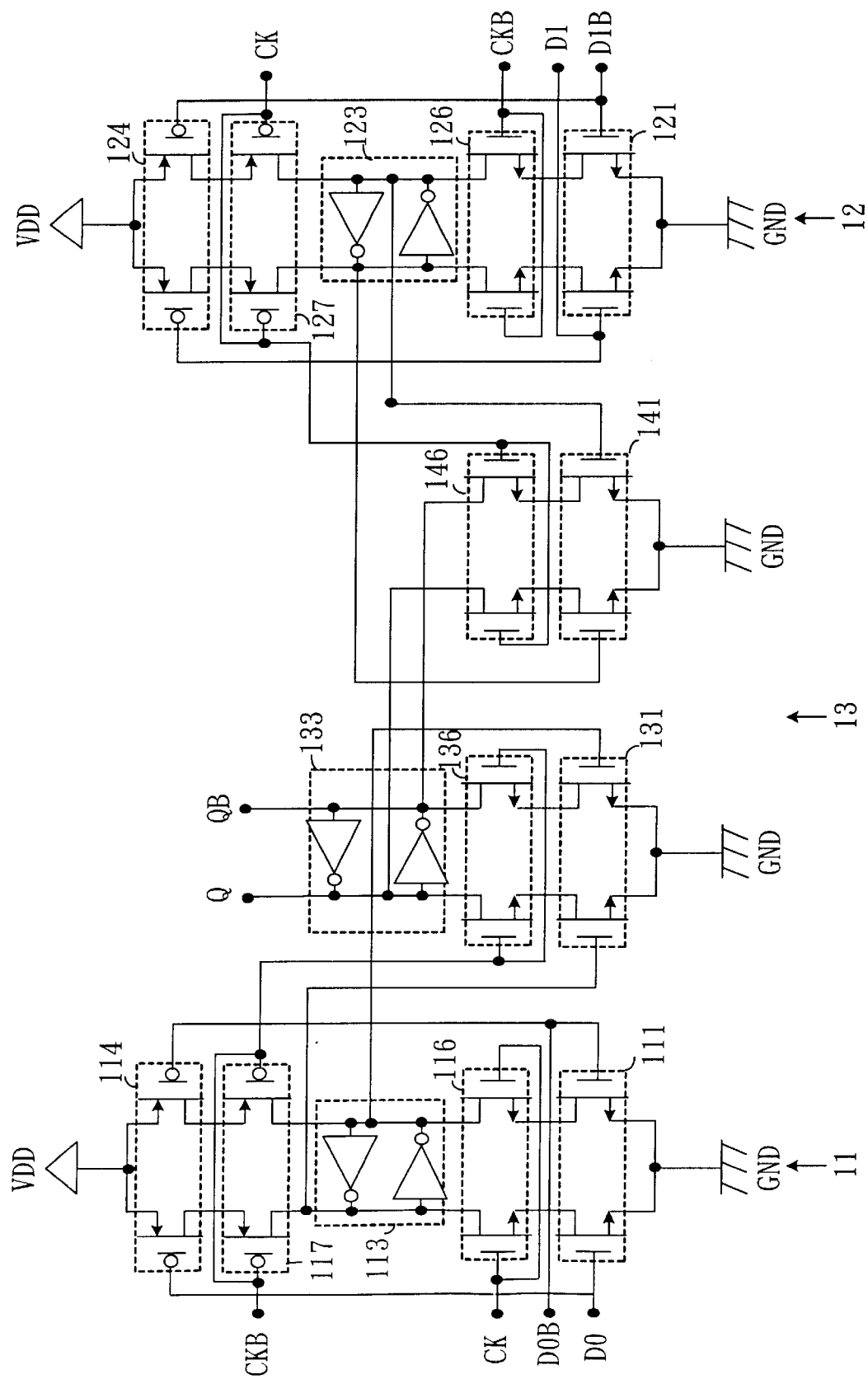
FIG. 8 shows an eighth embodiment of the fully differential double edge triggered flip-flop of the present invention.

FIG. 8 shows an eighth embodiment of the fully differential double edge triggered flip-flop of the present invention. The difference from the structure in FIG. 5 is that the structure in FIG. 8 only adds the fourth differential pairs 117 and 127 and the second differential pairs 114 and 124 on the first repeater 113 and 123 of the first master circuit and the second master circuit. Another advantage of the structure in FIG. 8 is to have a smaller setup time and hold time.

Figure 9:
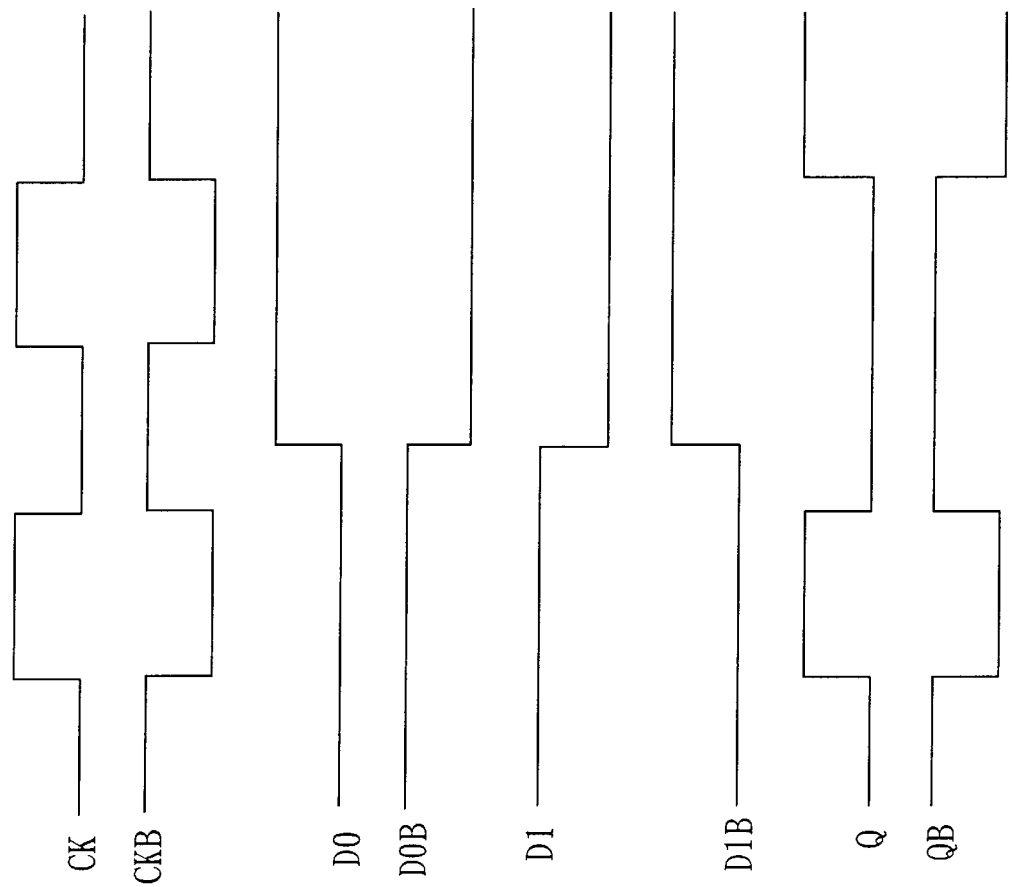
FIG. 9 shows a timing diagram of the fully differential double edge triggered flip-flop of the present invention.

FIG. 9 shows a timing diagram of the fully differential double edge triggered flip-flop 10 of the present invention. On the trailing edges of the clock CK (the leading edges of the clock CKB), the fully differential double edge triggered flip-flop 10 of the present invention captures the first fully differential input values D0 and D0B. On the leading edges of the clock, the fully differential double edge triggered flip-flop 10 of the present invention captures the second fully differential input values D1 and D1B. The two terminals Q and QB of the second repeater 133 of the slave circuit 13 will sequentially output the first fully differential input value and the second fully differential input value. In other words, the fully differential double edge triggered flip-flop 10 of the present invention can capture and output data on the leading and trailing edges of the clock, therefore the output frequency of the present invention is two times of the frequency of the clock CK.

The above-described embodiments of the present invention are intended to be illustrative only. Numerous alternative embodiments may be devised by those skilled in the art without departing from the scope of the following claims.

What is claimed is:

1. A fully differential double edge triggered flip-flop, storing and outputting first and second fully differential input values on leading and trailing edges of a clock, comprising:

a first fully differential master circuit storing the first fully differential input value on the leading edge of the clock;

a second fully differential master circuit storing the second fully differential input value on the trailing edge of the clock; and a fully differential slave circuit electrically connected to outputs of the first and second fully differential master circuits, said fully differential slave circuit including a first repeater as an output end of said fully differential double edge triggered flip-flop; said fully differential slave circuit outputting said first fully differential input value during the period from the leading edge to trailing edge of the clock, and outputting said second fully differential input value during the period from the trailing edge to leading edge of the clock.

2. The fully differential double edge triggered flip-flop of claim 1, wherein said first fully differential master circuit comprises:

a first transistor switch activated by the leading edge of the clock;

a first differential pair electrically connected to an output end of the first transistor switch, and the input of said first differential pair being said first fully differential input value; and a second repeater electrically connected to an output end of the first differential pair for storing the first fully differential input value.

3. The fully differential double edge triggered flip-flop of claim 1, wherein said second fully differential master circuit comprises:

a first transistor switch activated by the trailing edge of the clock;

a first differential pair electrically connected to an output end of the first transistor switch, and the input of said first differential pair being said second fully differential input value; and a second repeater electrically connected to an output end of the first differential pair for storing the second fully differential input value.

4. The fully differential double edge triggered flip-flop of claim 1, wherein said fully differential slave circuit comprises:

a third transistor switch activated by the trailing edge of the clock;

a fourth transistor switch activated by the leading edge of the clock;

a fifth differential pair electrically connected to an output end of the third transistor switch, and the input end of said fifth differential pair electrically connected to an output end of the first master circuit;

a sixth differential pair electrically connected to an output end of the fourth transistor switch, and the input end of said sixth differential pair electrically connected to an output end of the second master circuit; and a second repeater electrically connected to output ends of the fifth and sixth differential pairs, and serving as an output of said fully differential double edge triggered flip-flop serving.

5. The fully differential double edge triggered flip-flop of claim 1, wherein said first fully differential master circuit comprises:

a first transistor switch activated by the leading edge of the clock;

a first differential pair electrically connected to an output end of the first transistor switch, and the input of said first differential pair being said first fully differential input value; and a second repeater electrically connected to an output end of the first differential pair for storing the first fully differential input value;

a second differential pair having an opposite polarity to that of the first differential pair, said second differential pair electrically connected to the first repeater, and the input of said second differential pair being the first fully differential input value; and a second transistor switch having an opposite polarity to that of the first transistor switch, said second transistor switch electrically connected to the output end of the second differential pair, and said second transistor switch activated by the trailing edge of the clock.

6. The fully differential double edge triggered flip-flop of claim 1, wherein said second fully differential master circuit comprises:

a first transistor switch activated by the trailing edge of the clock;

a first differential pair electrically connected to an output end of the first transistor switch, and the input of said first differential pair being said second fully differential input value;

a first repeater electrically connected to an output end of the second differential pair for storing the second fully differential input value;

a second differential pair having an opposite polarity to that of the first differential pair, electrically connected to the first repeater, and the input of said second differential pair being the second fully differential input value; and a second transistor switch having an opposite polarity to that of the first transistor switch, said second transistor switch electrically connected to an output end of the second differential pair, and said second transistor switch activated by the leading edge of the clock.

7. The fully differential double edge triggered flip-flop of claim 1, wherein said fully differential slave circuit comprises:

a third transistor switch activated by the trailing edge of the clock;

a fifth differential pair electrically connected to an output end of the third transistor switch, and an input of the fifth differential pair electrically connected to an output end of the first master circuit;

a second repeater electrically connected to an output end of the fifth differential pair, and serving as the output of said fully differential double edge triggered flip-flop;

a ninth differential pair having an opposite polarity to that of the fifth differential pair, said ninth differential pair electrically connected to the second repeater, and the input end of said ninth differential pair electrically connected to an output end of the first master circuit;

a fifth transistor switch having an opposite polarity to that of the third transistor switch, said fifth transistor switch electrically connected to the ninth differential pair, and said fifth transistor switch activated by the leading edge of the clock;

a fourth transistor switch activated by the leading edge of the clock;

a sixth differential pair electrically connected to an output end of the fourth transistor switch; the input end of said sixth differential pair electrically connected to an output end of the second master circuit, and the output end of said sixth differential pair electrically connected to the second repeater;

a tenth differential pair having an opposite polarity to that of the sixth differential pair; the output end of the tenth differential pair electrically connected to an output end of the sixth differential pair, and the input end of the tenth differential pair electrically connected to an output end of the second master circuit; and a sixth transistor switch having an opposite polarity to that of the fourth transistor switch, said sixth transistor switch electrically connected to an output end of the tenth differential pair, and said sixth transistor switch activated by the trailing edge of the clock.

8. The fully differential double edge triggered flip-flop of claim 1, wherein said first fully differential master circuit comprises:

a first differential pair whose input end receives said first fully differential input value, and one end of said first differential pair electrically connected to ground;

a third differential pair electrically connected to an output end of the first differential pair, and the input of said third differential pair activated by the leading edge of the clock; and a second repeater electrically connected to an output end of the third differential pair for storing the first fully differential input value.

9. The fully differential double edge triggered flip-flop of claim 1, wherein said second fully differential master circuit comprises:

a first differential pair whose input end receives said second fully differential input value, and one end of said first differential pair electrically connected to ground;

a third differential pair electrically connected to an output end of the first differential pair, and the input of said third differential pair activated by the trailing edge of the clock; and a first repeater electrically connected to an output end of the third differential pair for storing the second fully differential input value.

10. The fully differential double edge triggered flip-flop of claim 1, wherein said fully differential slave circuit comprises:

a fifth differential pair whose input end is connected to the output end of the first master circuit, and one end of the fifth differential pair electrically connected to ground;

a seventh differential pair electrically connected to an output end of the fifth differential pair, and the input of said seventh differential pair activated by the trailing edge of the clock;

a second repeater electrically connected to an output end of the seventh differential pair, and acted as the output end of said fully differential double edge triggered flip-flop;

a sixth differential pair whose input end receives the output of the second master circuit, and one end of the sixth differential pair electrically connected to ground; and an eighth differential pair electrically connected to an output end of the sixth differential pair; the input of said eighth differential pair activated by the leading edge of the clock, and the output end of said eighth differential pair electrically connected to the second repeater.

11. The fully differential double edge triggered flip-flop of claim 1, wherein said first fully differential master circuit comprises:

a first differential pair whose input end receives said first fully differential input value, and one end of said first differential pair electrically connected to ground;

a third differential pair electrically connected to an output end of the first differential pair, and the input of said third differential pair activated by the leading edge of the clock;

a second repeater electrically connected to an output end of the third differential pair for storing the first fully differential input value;

a fourth differential pair having an opposite polarity to that of the third differential pair, said fourth differential pair electrically connected to an output end of the third differential pair, and the input of the fourth differential pair activated by the trailing edge of the clock; and a second differential pair having an opposite polarity to that of the first differential pair, said second differential pair electrically connected to an output end of the fourth differential pair; the input of the second differential pair receiving the first fully differential input value, and one end of the second differential pair electrically connected to a power source.

12. The fully differential double edge triggered flip-flop of claim 1, wherein said second fully differential master circuit comprises:

a first differential pair whose input receives said second fully differential input value, and one end of said first differential pair electrically connected to ground;

a third differential pair electrically connected to an output end of the first differential pair, and the input of said third differential pair activated by the trailing edge of the clock;

a second repeater electrically connected to an output end of the third differential pair for storing the second fully differential input value;

a fourth differential pair having an opposite polarity to that of the third differential pair, said fourth differential pair electrically connected to an output end of the third differential pair, and the input of the fourth differential pair activated by the leading edge of the clock; and a second differential pair having an opposite polarity to that of the first differential pair, said second differential pair electrically connected to an output end of the fourth differential pair; the input of the second differential pair receiving the second fully differential input value, and one end of the second differential pair electrically connected to a power source.

13. The fully differential double edge triggered flip-flop of claim 1, wherein said fully differential slave circuit comprises:

a fifth differential pair whose input end is electrically connected to an output end of the first master circuit, and one end of the fifth differential pair electrically connected to ground;

a seventh differential pair electrically connected to an output end of the fifth differential pair, and the input of said seventh differential pair activated by the trailing edge of the clock;

a second repeater electrically connected to an output end of the seventh differential pair, and serving as the output of said fully differential double edge triggered flip-flop;

an eleventh differential pair having an opposite polarity to that of the seventh differential pair, said eleventh differential pair electrically connected to an output end of the seventh differential pair, and the input of the eleventh differential pair activated by the leading edge of the clock;

a ninth differential pair having an opposite polarity to that of the fifth differential pair, said ninth differential pair electrically connected to an output end of the eleventh differential pair; the input of the ninth differential pair electrically connected to an output end of the first master circuit, and one end of the ninth differential pair electrically connected to a power source;

a sixth differential pair whose input end electrically connected to an output end of the second master circuit, and one end of the sixth differential pair electrically connected to ground;

an eighth differential pair electrically connected to an output end of the sixth differential pair; the input of said eighth differential pair activated by the leading edge of the clock, and the output end of said eighth differential pair electrically connected to the second repeater;

a twelfth differential pair having an opposite polarity to that of the eighth differential pair, said twelfth differential pair electrically connected to an output end of the eighth differential pair; the input of the twelfth differential pair activated by the trailing edge of the clock; and a tenth differential pair having an opposite polarity to that of the sixth differential pair; the input end of the tenth differential pair electrically connected to an output end of the second master circuit, one end of the tenth differential pair electrically connected to a power source, and another end of the tenth differential pair electrically connected to the twelfth differential pair.

* * * * *